United States Patent
Hickling et al.

(10) Patent No.: US 6,323,696 B1
(45) Date of Patent: Nov. 27, 2001

(54) SAMPLE AND HOLD CIRCUIT

(75) Inventors: Ronald M. Hickling, Newbury Park; Joel N. Schulman, Malibu; David H. Chow, Newbury Park; Lap W. Chow, South Pasaena; Hector J. De Los Santos, Inglewood, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/456,359

(22) Filed: Dec. 7, 1999

(51) Int. Cl.$^7$ .................................................. G11C 27/02
(52) U.S. Cl. ............................................ 327/92; 327/94
(58) Field of Search ................................ 327/91, 92, 93, 327/94, 196, 494, 500, 502, 508; 341/122

(56) References Cited

U.S. PATENT DOCUMENTS

| | | | |
|---|---|---|---|
| 3,596,191 | * 7/1971 | Stuckert | 327/92 |
| 3,721,829 | * 3/1973 | Benson | 327/92 |
| 3,889,134 | 6/1975 | Basham | 327/94 |
| 3,983,419 | 9/1976 | Fang | 327/94 |
| 4,233,528 | 11/1980 | Hogeboom | 327/94 |
| 4,308,468 | 12/1981 | Olson | 327/94 |
| 4,393,318 | 7/1983 | Takahashi et al. | 327/94 |
| 4,636,659 | 1/1987 | Sugimoto | 327/93 |
| 4,659,945 | 4/1987 | Metz | 327/92 |
| 4,873,457 | 10/1989 | Sanielevici | 327/94 |
| 4,879,478 | 11/1989 | Gerson | 327/93 |
| 4,885,545 | * 12/1989 | Sanielevici | 327/92 |
| 5,036,219 | 7/1991 | Dingwall et al. | 327/92 |
| 5,039,880 | 8/1991 | Astegher et al. | 327/96 |
| 5,227,676 | 7/1993 | Bahr et al. | 327/94 |
| 5,243,235 | 9/1993 | Wakayama et al. | 327/92 |
| 5,350,952 | 9/1994 | Cheng et al. | 327/94 |
| 5,572,154 | * 11/1996 | Rakers et al. | 327/92 |
| 5,838,175 | * 11/1998 | Hsieh | 327/94 |
| 6,243,435 | * 6/2001 | Broekaert | 377/128 |

* cited by examiner

*Primary Examiner*—My-Trang Nuton
(74) *Attorney, Agent, or Firm*—Terje Gudmestad

(57) ABSTRACT

A sample and hold circuit that is coupled to a control voltage source and a signal source has a sampling bridge coupled in series between a first resonant tunneling diode. The bridge comprises a plurality of diodes. The sampling bridge couples an input voltage signal that is to be sampled to a holding capacitor when the sampling bridge is forward biased. The bridge substantially decouples the input voltage signal from the holding capacitor when the sampling bridge diodes are reversed biased. The resonant tunneling diodes when reversed biased allow the bridge to be isolated from the control voltage source to allow the holding capacitor to float at the sampled value of the input voltage.

25 Claims, 5 Drawing Sheets

SAMPLE AND HOLD CIRCUIT

TECHNICAL FIELD

The present invention relates generally to high speed data transmission systems. More specifically, the present invention relates to a sample and hold system for such systems.

BACKGROUND ART

Sample and hold circuits are used to convert a continuous electrical signal into a discrete-amplitude signal. Sample and hold circuits hold a fixed value for a time between each sample. The signal is held so that subsequent electronic stages can read and process each sample value.

Track and hold circuits are also used to accomplish a similar function. The distinction between a sample and hold circuit and a track and hold circuit is that the sample and hold circuit samples a signal at a specific time instead of allowing the circuit to drift with the incoming signal during periods when the signal is not held.

One potential use for a sample and hold circuit is at the front end of a satellite or radar receiver to convert an incoming continuous signal into a sequence of discrete points for subsequent digital signal processing. Usually, the signal processing function involves analog-to-digital conversion followed by digital signal processing.

Often, track and hold circuits are referred to as sample and hold circuits. However, these circuits are not true sample and hold circuits since they allow the signal to drift with the incoming signal.

One problem with currently known sample and hold circuits is that they typically cannot sample high frequency signals (up to 100 GHz) due to their slow response times.

Several known implementations of sample and hold or track and hold circuits are known. For high frequency circuits, a track and hold circuit using a diode bridge is used. The diode bridge architecture is advantageous due to its speed and simplicity. However, the circuits are commonly track and hold circuits rather than true sample and hold circuits because the output signal is not held fixed during part of the clock cycle. Thus, another disadvantage of track and hold circuits is that the correspondence between the signal and the timing sample is unspecified for about half the clock cycle. This imprecision in determining the time corresponding to a given value is a form of timing jitter. Timing jitter is disadvantageous for subsequent signal processing.

Other sample and hold circuits are transistor-based. These circuits are generally slower than the previously mentioned diode bridge circuits. Slower circuits cannot be used for high frequency applications.

Other sample and hold circuits use Josephson junctions and tunnel diodes. Such circuits are impractical to implement and are believed to not have the required speed for high frequency applications.

SUMMARY OF THE INVENTION

It is, therefore, one object of the invention to provide a true sample and hold circuit capable of performing at high frequencies.

In one aspect of the invention, a sample and hold circuit that is coupled to a control voltage source and a signal source has a sampling bridge coupled in series between a first resonant tunneling diode. The bridge comprises a plurality of diodes. The sampling bridge couples an input voltage signal that is to be sampled to a holding capacitor when the sampling bridge is forward biased. The bridge substantially decouples the input voltage signal from the holding capacitor when the sampling bridge diodes are reversed biased. The resonant tunneling diodes when reversed biased allow the bridge to be isolated from the control voltage source to allow the holding capacitor to float at the input voltage after sampling.

One advantage of the invention is that the integrated circuit area for the implementation of such a circuit is relatively small. Another advantage of the invention is that the circuit uses a relatively low amount of power and has relatively few components.

Other objects and features of the present invention will become apparent when viewed in light of the detailed description of the preferred embodiment when taken in conjunction with the attached drawings and appended claims.

BEST MODE(S) FOR CARRYING OUT THE INVENTION

Figure 1:
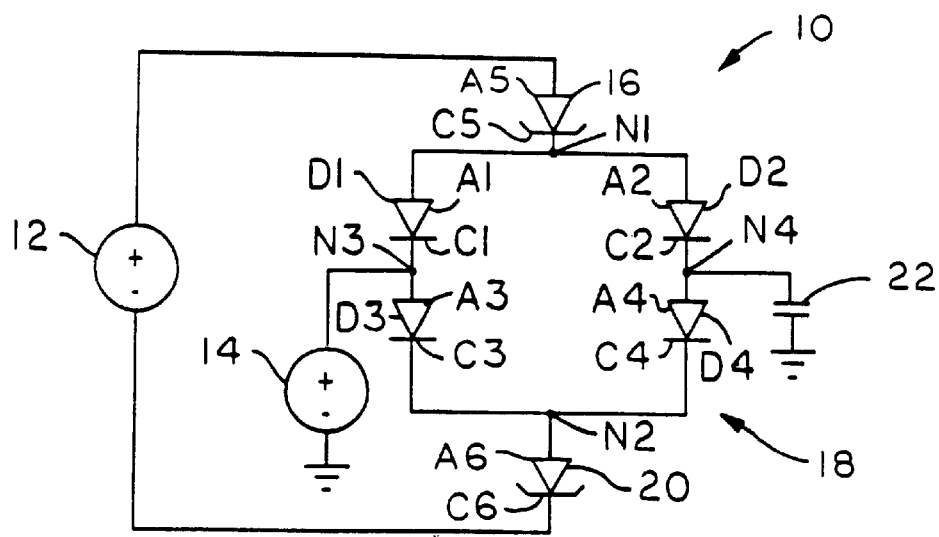
FIG. 1 is a schematic circuit diagram of a sample and hold circuit formed according to the present invention.

A sample and hold circuit 10 in accordance with the present invention is shown in FIG. 1. The circuit 10 is coupled to a control voltage source 12 and an input signal source 14. The sample and hold circuit 10 generally comprises a first resonant tunneling diode 16, a sampling bridge 18 and a second resonant tunneling diode 20. Sampling bridge 18 is coupled to a holding capacitor 22. Preferably, the first resonant tunneling diode 16, sampling bridge 18 and second resonant tunneling diode 20 are coupled in series with the control voltage source 12.

Sampling bridge 18 selectively couples the signal source 14 to holding capacitor 22. Resonant tunneling diode 16 has an anode $A_5$ and a cathode $C_5$. Second resonant tunneling diode 20 has a sixth anode $A_6$ and a sixth cathode $C_6$. Holding capacitor 22 stores the output voltage of the circuit.

The resonant tunneling diodes preferably have similar electrical characteristics. Also, diodes $D_1$, $D_2$, $D_3$ and $D_4$ are preferably Schottky diodes and each have substantially similar electrical characteristics. Preferably, diodes $D_1$, $D_2$, $D_3$ and $D_4$ are fabricated on the same semiconductor substrate. Resonant tunneling diodes 16 and 20 are also preferably constructed on the same substrate. Diodes $D_1$, $D_2$, $D_3$ and $D_4$ and resonant tunneling diodes 16 and 20 may all be fabricated on the same substrate.

One suitable substrate is indium phosphide (InP). The purpose of adding the resonant tunneling diodes 16 and 20 is that since the resonant tunneling diodes are fast, the rising and falling edges of the control voltage source can produce very sharp spikes in time, sharper than the source itself can produce. This gives finer resolution on the sampling than without resonant tunneling diodes.

Sampling bridge 18 has a first diode $D_1$ having a first anode $A_1$ and a first cathode $C_1$, a second diode $D_2$ having a second anode $A_2$ and a second cathode $C_2$, a third diode $D_3$ having a third anode $A_3$ and a third cathode $C_3$, and a fourth diode $D_4$ having a fourth anode $A_4$ and a fourth cathode $C_4$.

Sampling bridge 18 has four nodes $N_1$, $N_2$, $N_3$ and $N_4$. Anode $A_1$, anode $A_2$ and cathode $C_5$ are coupled to node $N_1$. Cathode $C_3$, cathode $C_4$ and anode $A_6$ are coupled to node $N_2$. Cathode $C_1$, anode $A_3$ and input signal source 14 are coupled to node $N_3$. Cathode $C_2$, anode $A_4$ and holding capacitor 22 are coupled to node $N_4$. The operation of bridge 18 when each of diodes $D_1$, $D_2$, $D_3$ and $D_4$ are forward biased, allows holding capacitor 22 to track or follow the input voltage from input signal source 14. When forward biased, the bridge circuit is "transparent". When the signal from the control voltage source 12 is negative or zero, diodes $D_1$, $D_2$, $D_3$ and $D_4$ are reversed biased. When the diodes are reversed biased, any change in the charge on the holding capacitor 22 is prevented, that is, the voltage across holding capacitor 22 is held.

Figure 2:
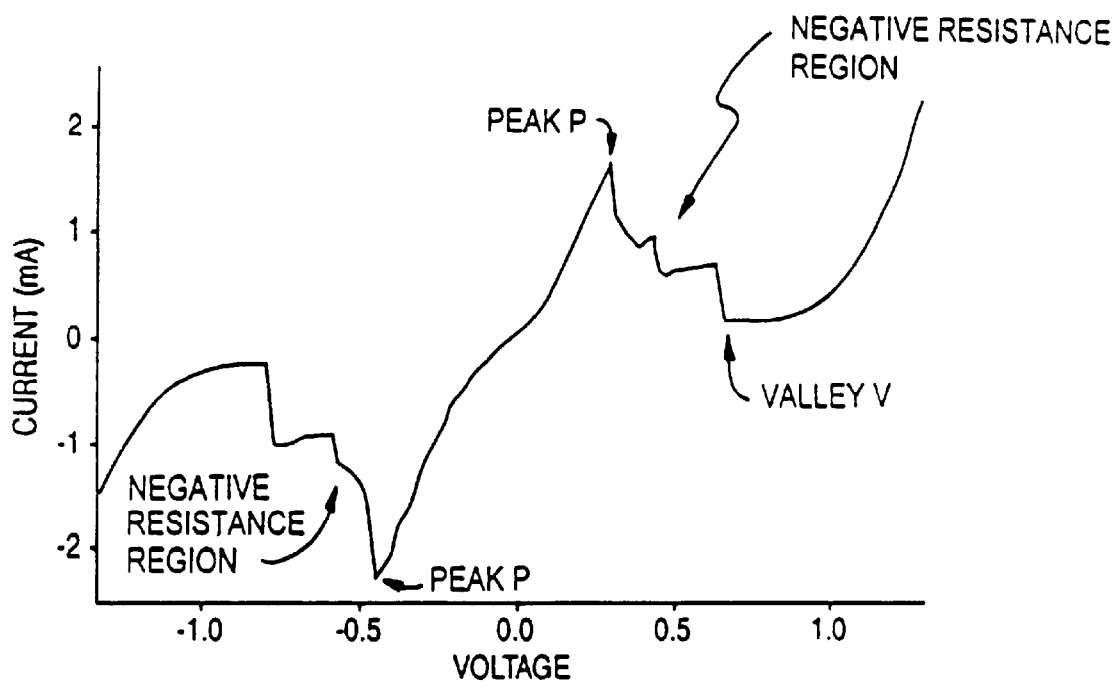
FIG. 2 is a current-voltage plot of a suitable resonant tunneling diode for use in the present invention.

Resonant tunneling diodes 16 and 20 preferably have a current-voltage characteristic curve, as illustrated in FIG. 2.

Figure 3:
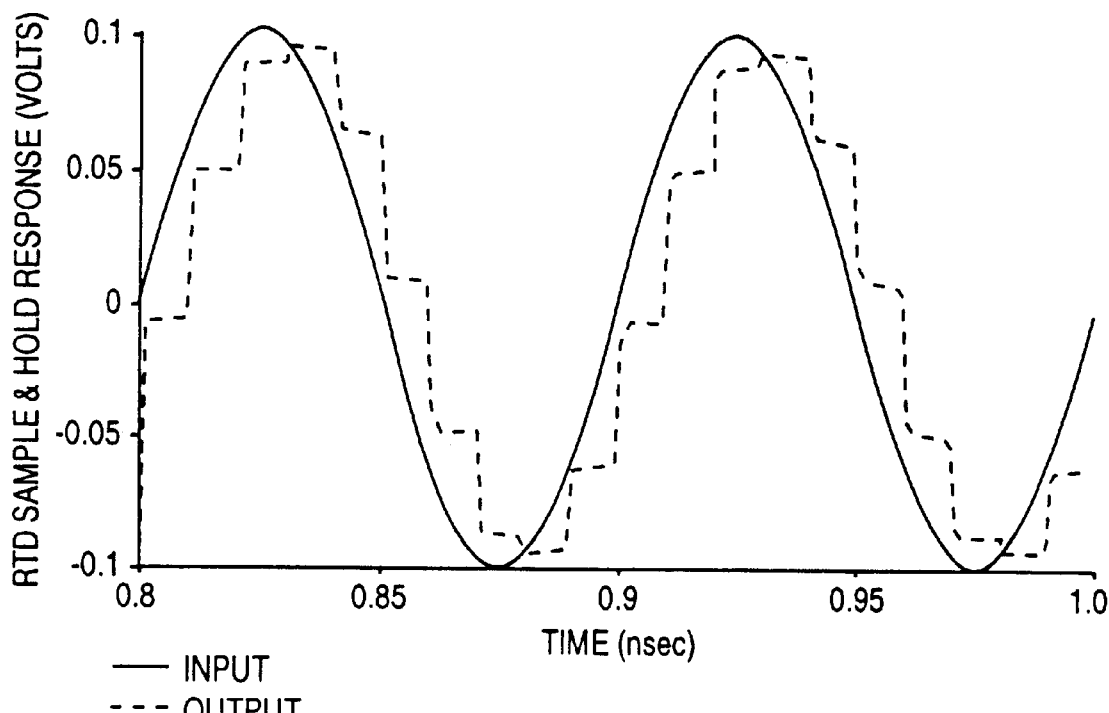
FIG. 3 is a plot of voltage versus time of the input signal and the output signal as processed by the circuit of FIG. 1.

Referring now also to FIG. 3, the output at holding capacitor 22 and the input from input signal source 14 are plotted in voltage versus time.

As the bias voltage from the control voltage source 12 increases past the threshold of diodes $D_1$, $D_2$, $D_3$ and $D_4$, current will begin to flow through resonant tunneling diodes 16 and 20. The voltage signal from input signal source 14 is thus the voltage across holding capacitor 22. Current flow will, however, be stopped when resonant tunneling diode 16 and 20 switches to the off state. This will allow holding capacitor 22 to hold the output voltage at the sampled value.

By using two resonant tunneling diodes in the circuit, sampling bridge 18 is insured to be isolated from the control voltage source 12 when the resonant tunneling diodes are non-conducting. This allows holding capacitor 22 to "float" at the sampled value of the input signal source.

Referring to FIG. 2, the current-voltage plot for a desirable resonant tunneling diode has a valley V and a peak P. The positions of valley V and the peak P can be adjusted in the manufacturing of the resonant tunneling diode by varying the chemical composition of the various layers. Preferably, the electrical characteristics are such that the valley V and peak P of each resonant tunneling diode are matched similarly. Also, the slope before the peak and after the valley are also preferably substantially matched. This allows the sampling bridge to remain balanced during the operation of the sample and hold circuit 10.

Figure 4:
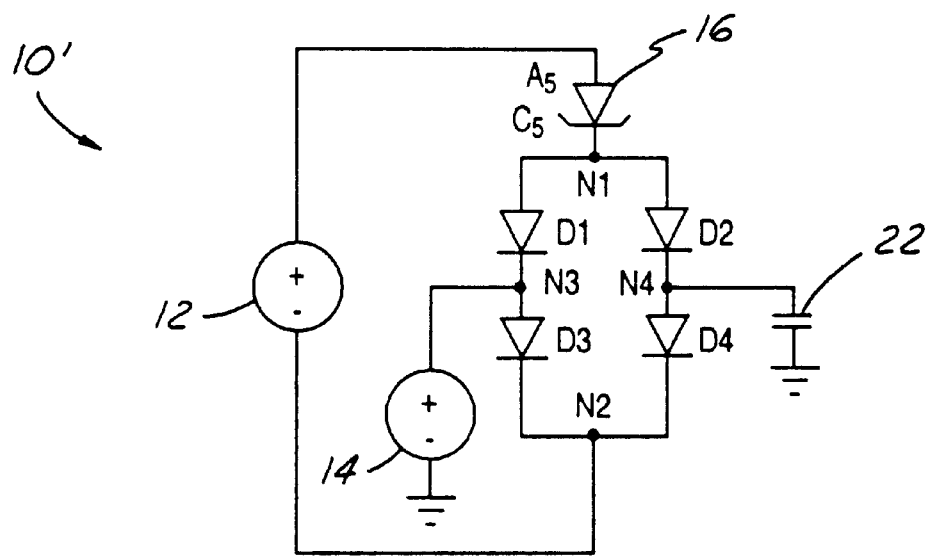
FIG. 4 is a schematic circuit diagram of a first alternative embodiment of a sample and hold circuit of the present invention.

Referring now to FIG. 4, identical elements from FIG. 1 are labeled with identical reference numerals. The difference between FIG. 4 and FIG. 1 is that the second resonant tunneling diode 20 has been eliminated. It should be noted above that in FIG. 1, voltage source 12 is not coupled to ground. That is, voltage source 12 is isolated from ground. The output waveform of FIG. 3 is nearly identical to the output of circuit 10' of FIG. 4. This is true when the drive voltage loop is completely isolated from ground.

In actual circuit implementations such as that on a spacecraft, using one RTD has experimentally been found to provide slightly superior results where voltage source 12 is truly a floating source.

Implementation of a truly floating voltage source is extremely difficult to accomplish in practice and particularly as a circuit suitable for incorporation into a high speed integrated circuit.

Figure 5:
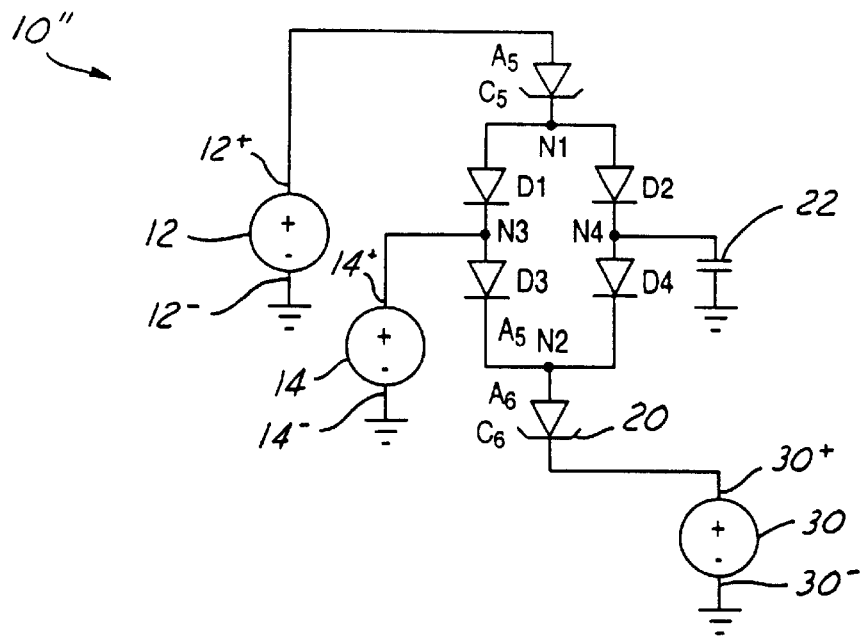
FIG. 5 is a schematic circuit diagram of a second alternative embodiment of a sample and hold circuit of the present invention.

Referring now to FIG. 5, in a practical implementation, it is desirable to eliminate the need for a floating drive. A circuit 10" of an alternative embodiment is shown in FIG. 5. Identical components to those shown in FIG. 1 are identified with identical reference numerals. The difference between FIG. 5 and FIG. 1 is the addition of a complementary drive voltage source 20 having a positive terminal $30^+$ and a negative terminal $30^-$. In this case, voltage source 12 has a positive terminal $12^+$ and a negative terminal $12^-$. The circuit of FIG. 5 does not use a floating voltage source as in FIGS. 1 and 4. Rather, negative terminal $12^-$ and negative terminal $30^-$ are coupled to a common ground. Likewise, input signal source 14 has a negative terminal $14^-$ coupled to the common ground.

It should be noted that the complementary drive voltage from complementary drive voltage source 30 is the opposite (negative) of control voltage from control voltage source 12. One restriction on the circuit of FIG. 5 is that the control voltage from control voltage source 12 and input signal from input signal source 14 must be within prescribed ranges for the circuit to be "transparent." That is, control voltage and input voltage must be selected to be within the current source region of the resonant tunneling diodes 16, 20. This is contrary to the circuits shown in FIGS. 1 and 4, in which no input voltage restriction is required. If the control voltage is within the narrow range defined above, the sample and hold circuit will be transparent. Otherwise, the sample and hold circuit is latched, provided that the resonant tunneling diodes are not overdriven into the exponential region. Simultaneously, the input signal from input signal source should, at all times, be within the predescribed range above. Otherwise, the sample and hold circuit may introduce distortion.

Figure 6:
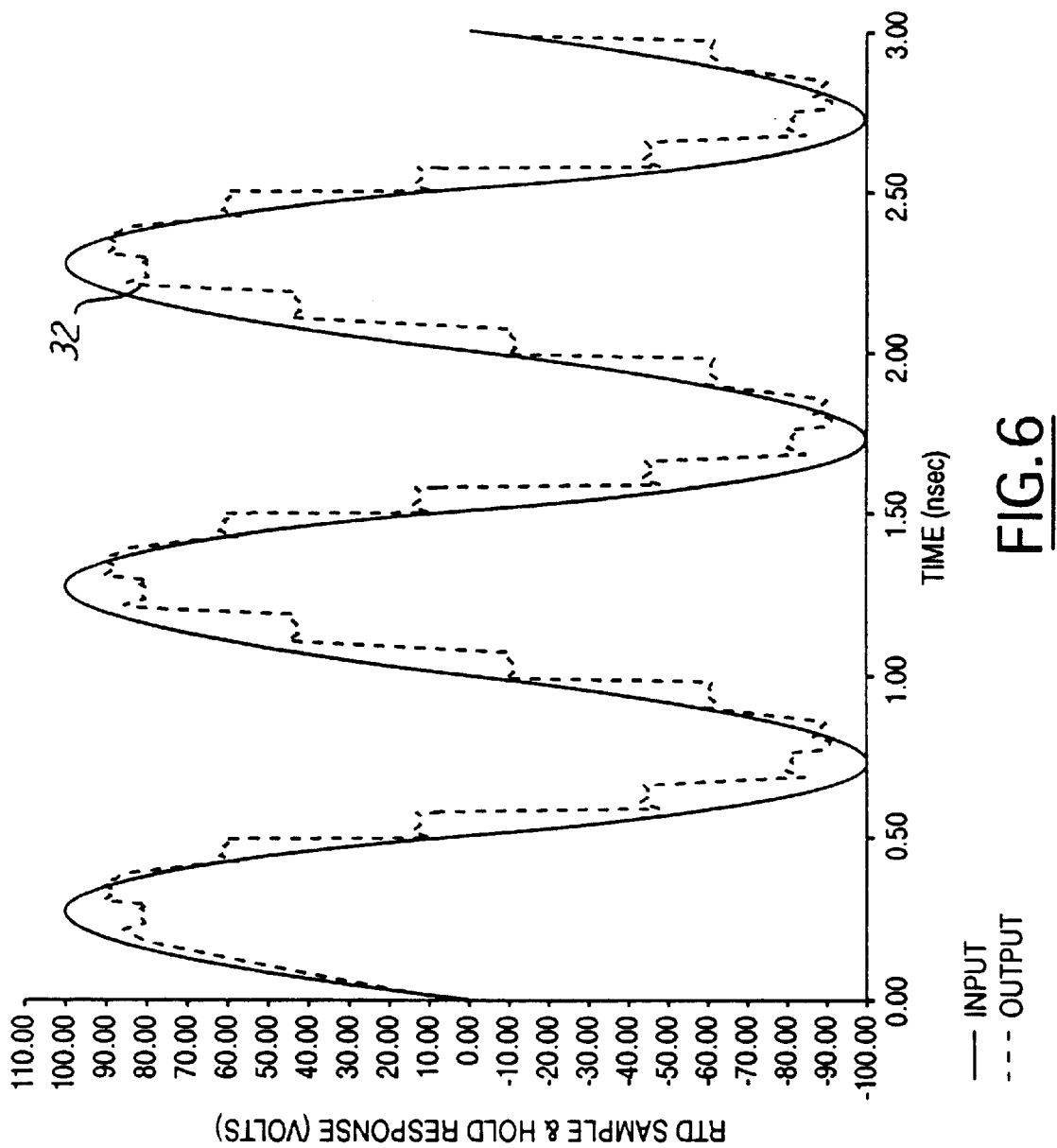
FIG. 6 is a plot of voltage versus time of the input signal and the output signal as processed by the circuit of FIG. 5.

Referring now to FIG. 6, a simulation of the output of the sample and hold circuit of FIG. 5 is shown. The output, however, has noise from net charge being delivered to the hold capacitor 22. The net charge manifests itself as clock feed through noise 32, which slightly distorts the output signal.

Figure 7:
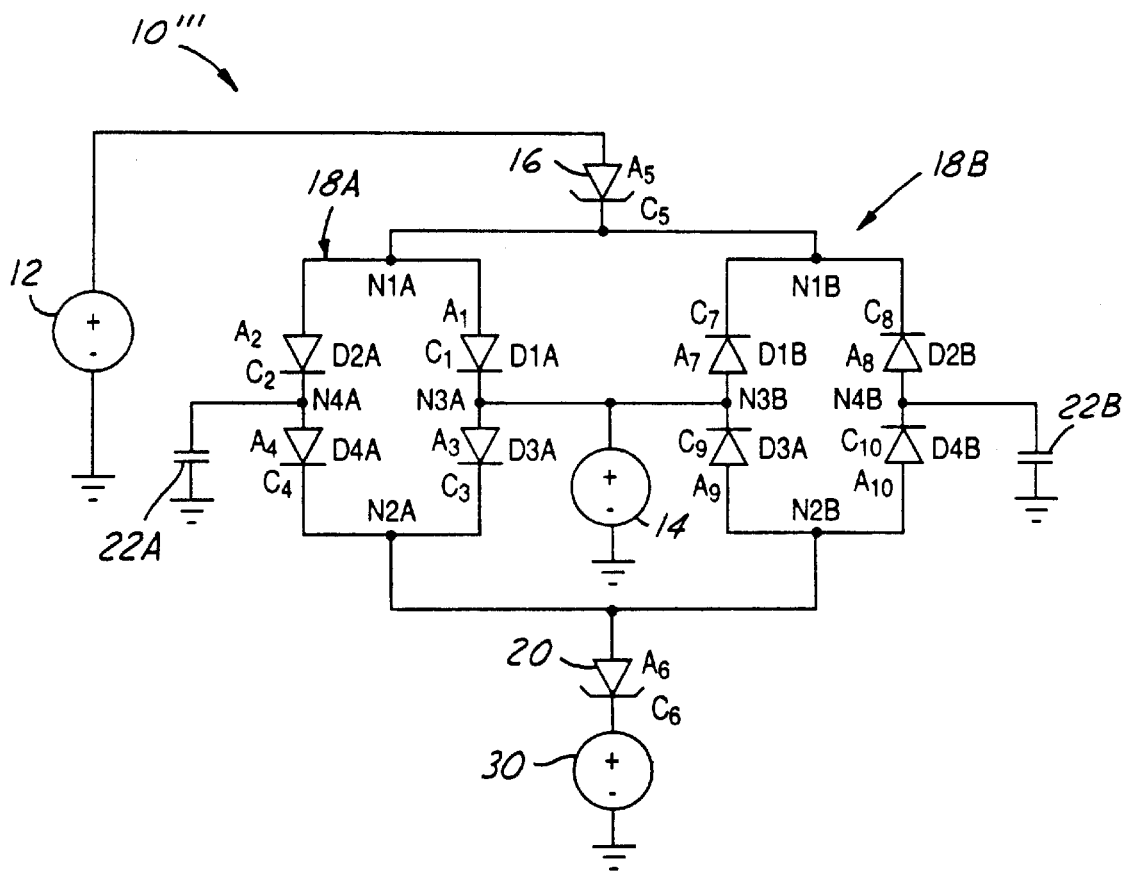
FIG. 7 is a schematic circuit diagram of a third alternative embodiment of a sample and hold circuit of the present invention.

Referring now to FIG. 7, a circuit 10''' that alleviates the clock feed through noise problem of FIG. 5 is illustrated. Identical elements from FIGS. 1 and 5 are identified with identical reference numerals. In this circuit 10''', two sampling bridges 18A and 18B are illustrated. Sampling bridges 18A, 18B are in parallel.

First sampling bridge 18A has four nodes N1A, N2A, N3A, and N4A. Likewise, sampling bridge 18B also has four nodes N1B, N2B, and N3B and N4B. Each sampling bridge 18A also has four diodes. First sampling bridge 18A has diode D1A, D2A, D3A, and D4A. Sampling bridge 18B has diodes D1B, D2B, D3B, and D4B. Nodes N3A and N3B are coupled to input signal source 14. Nodes N4A and N4B are coupled to respective holding capacitors 22A, 22B. Node 1A is coupled to an anode A1 of diode D1A and anode A2 of diode D2A. Node N2A is coupled to cathode C3 of diode D3A and cathode C4 of diode D4A. Node N3A is coupled to cathode C1 of diode D1A and anode A3 of diode D3A. Node N4A is coupled to cathode C2 of diode D2A and anode A4 of diode D4A. Node N1B is coupled to cathode C7 of diode D1B and cathode C8 of diode D2B. Node N2B is coupled to anode A9 of diode D3B and anode A11 of diode D4B. Node N3B is coupled to anode A7 of diode D1B and cathode C9 of diode D3B. Node N4B is coupled to anode A8 of diode D2B and cathode C10 of diode D4B.

Figure 8:
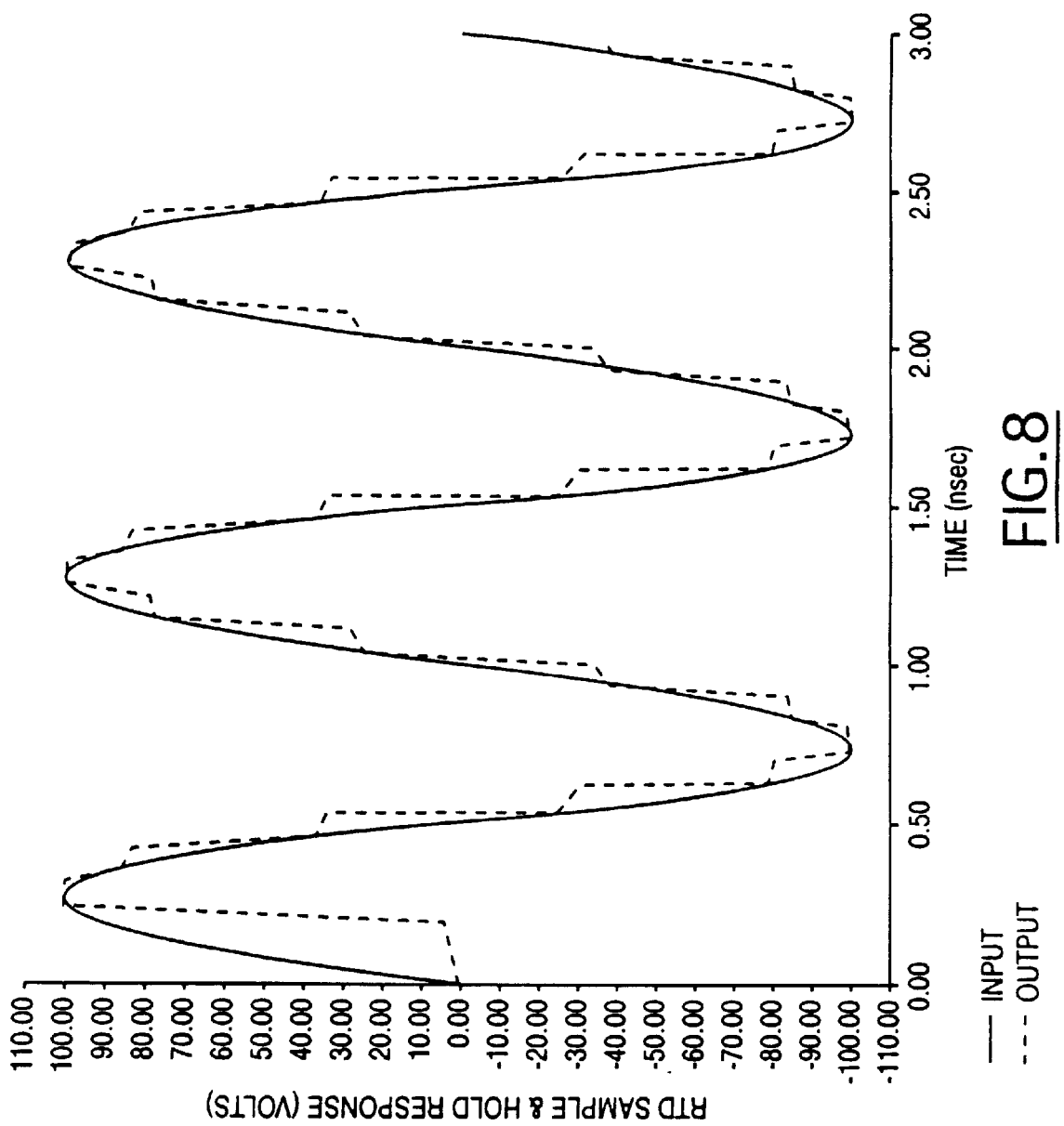
FIG. 8 is a plot of voltage versus time of the input signal and the output signal as processed by the circuit of FIG. 7.

Referring now to FIG. 8, the output of capacitor 22A is shown with respect to the input signal from input signal source 14. In comparison to FIG. 6, the clock feed through noise is not apparent in the output signal of the circuit of FIG. 7.

While particular embodiments of the invention have been shown and described, numerous variations and alternate embodiments will occur to those skilled in the art. Accordingly, it is intended that the invention be limited only in terms of the appended claims.

What is claimed is:

1. A sample and hold circuit for coupling to a control voltage source and a signal source comprising:
    a holding capacitor;
    a first resonant tunneling diode having a current-voltage characteristic curve, having a peak and a valley, wherein first slope before the peak and second slope after the valley are substantially matched; and
    a first sampling bridge coupled in series with said first resonant tunneling diode, said bridge comprising a plurality of diodes, said first sampling bridge coupling an input voltage signal to be sampled to said holding capacitor when the first sampling bridge is forward biased, and substantially decoupling the input voltage signal from the holding capacitor when the first sampling bridge is reverse biased.

2. A sample and hold circuit as recited in claim 1 further comprising a second resonant tunneling diode coupled in series with said bridge and said first resonant tunneling diode.

3. A sample and hold circuit as recited in claim 2 wherein said first resonant tunneling diode, said second resonant tunneling diode, said bridge and the control voltage source are coupled in series.

4. A sample and hold circuit as recited in claim 2 wherein said first resonant tunneling diode is coupled between said bridge and a positive input to said control voltage source.

5. A sample and hold circuit as recited in claim 2 wherein said second resonant tunneling diode is coupled between said bridge and a negative input to said control voltage source.

6. A sample and hold circuit as recited in claim 2 wherein said second resonant tunneling diode is coupled between said bridge and a positive input to a complementary control voltage source.

7. A sample and hold circuit as recited in claim 6 wherein said complementary control voltage is coupled to ground and said control voltage source is coupled to ground.

8. A sample and hold circuit as recited in claim 1 wherein said plurality of diodes comprises a first diode having a first anode and a first cathode, a second diode having a second anode and a second cathode, a third diode having a third anode and a third cathode, and a fourth diode having a fourth anode and a fourth cathode.

9. A sample and hold circuit as recited in claim 8 wherein said first anode is coupled to said second anode and said first resonant tunneling diode, said third cathode is coupled to said fourth cathode and said second resonant tunneling diode, said first cathode and said third anode is coupled to an input signal source, said second cathode and said fourth anode is coupled to said holding capacitor.

10. A sample and hold circuit as recited in claim 9 wherein said first resonant tunneling diode has a fifth anode and a fifth cathode and further comprising a second resonant tunneling diode having a sixth anode and a sixth cathode.

11. A sample and hold circuit as recited in claim 10 wherein said fifth cathode is coupled to said first anode and said second anode.

12. A sample and hold circuit as recited in claim 11 wherein said fifth anode is coupled to the control voltage source.

13. A sample and hold circuit as recited in claim 12 wherein said sixth anode is coupled to said third cathode and said fourth cathode.

14. A sample and hold circuit as recited in claim 1 further comprising a second holding capacitor and a second sampling bridge coupled in series with said first resonant tunneling diode and in parallel with said first sampling bridge, said second bridge comprising a second plurality of diodes, said second sampling bridge coupling the input voltage signal to be sampled to said second holding capacitor when the second sampling bridge is forward biased, and substantially decoupling the input voltage signal from the second holding capacitor when the second sampling bridge is reversed biased.

15. A sample and hold circuit as recited in claim 14 further comprising a second resonant tunneling diode coupled to said first sampling bridge and said second sampling bridge.

16. A sample and hold circuit as recited in claim 15 further comprising a complementary drive voltage source coupled to said second resonant tunneling diode.

17. A sample and hold circuit for coupling to a control voltage source and an input signal source comprising:
    a holding capacitor;
    a first resonant tunneling diode having a first electrical characteristic;
    a second resonant tunneling diode having a second electrical characteristic substantially similar to the first electrical characteristic;
    a first sampling bridge coupled in series between said first resonant tunneling diode and said second resonant tunneling diode, said bridge comprising a first diode having a first anode and a first cathode, a second diode having a second anode and a second cathode, a third diode having a third anode and a third cathode, and a fourth diode having a fourth anode and a fourth cathode, said first anode coupled to said second anode and said first resonant tunneling diode, said third cathode coupled to said fourth cathode and said second resonant tunneling diode, said first cathode and said third anode coupled to an input signal source, said second cathode and said fourth anode coupled to said holding capacitor.

18. A sample and hold circuit as recited in claim 17 wherein said first resonant tunneling, said second resonant tunneling diode, said bridge and the control voltage source are coupled in series.

19. A sample and hold circuit as recited in claim 17 wherein said first resonant tunneling diode has a fifth anode and a fifth cathode, said second resonant tunneling diode has a sixth anode and a sixth cathode.

20. A sample and hold circuit as recited in claim 19 wherein said fifth cathode is coupled to said first anode and said second anode.

21. A sample and hold circuit as recited in claim 19 wherein said fifth anode is coupled to the control voltage source.

22. A sample and hold circuit as recited in claim 21 wherein said sixth anode is coupled to said third cathode and said fourth cathode.

23. A sample and hold circuit as recited in claim 22 wherein said sixth cathode is coupled to the voltage source.

24. A sample and hold circuit as recited in claim 17 further comprising a second holding capacitor and a second sampling bridge coupled in series with said first resonant tunneling diode and with second resonant tunneling diode and in parallel with said first sampling bridge, said second bridge comprising a second plurality of diodes, said second sampling bridge coupling the input signal source to be sampled to said second holding capacitor when the second sampling bridge is forward biased, and substantially decoupling the input voltage signal from the second holding capacitor when the second sampling bridge is reversed biased.

25. A sample and hold circuit as recited in claim 17 further comprising a complementary drive voltage source coupled to said second resonant tunneling diode.

* * * * *